United States Patent
Nakamura

(10) Patent No.: US 9,472,590 B2
(45) Date of Patent: Oct. 18, 2016

(54) SOLID-STATE IMAGE CAPTURING DEVICE AND MANUFACTURING METHOD THEREOF

(71) Applicant: SEIKO EPSON CORPORATION, Tokyo (JP)

(72) Inventor: Noriyuki Nakamura, Sakata (JP)

(73) Assignee: SEIKO EPSON CORPORATION, Tokyo (JP)

( * ) Notice: Subject to any disclaimer, the term of this patent is extended or adjusted under 35 U.S.C. 154(b) by 0 days.

(21) Appl. No.: 14/818,624

(22) Filed: Aug. 5, 2015

(65) Prior Publication Data

US 2016/0064428 A1 Mar. 3, 2016

(30) Foreign Application Priority Data

Aug. 29, 2014 (JP) ................................ 2014-175875

(51) Int. Cl.
*H01L 27/146* (2006.01)

(52) U.S. Cl.
CPC ... *H01L 27/14643* (2013.01); *H01L 27/14616* (2013.01); *H01L 27/14689* (2013.01)

(58) Field of Classification Search
CPC ........... H01L 27/1461; H01L 27/1462; H01L 27/14643; H01L 27/14689
See application file for complete search history.

(56) References Cited

U.S. PATENT DOCUMENTS

| 5,438,211 | A | 8/1995 | Nakamura et al. |
| 6,850,278 | B1 | 2/2005 | Sakurai et al. |
| 7,714,263 | B2 | 5/2010 | Konishi |
| 7,973,835 | B2 | 7/2011 | Sakurai et al. |
| 8,102,443 | B2 | 1/2012 | Tsunai |
| 8,183,657 | B2 | 5/2012 | Kuwazawa |
| 8,363,141 | B2 | 1/2013 | Shinohara |
| 8,872,949 | B2 | 10/2014 | Shinohara |
| 2007/0084986 | A1* | 4/2007 | Yang ................. H01L 27/14603 250/208.1 |
| 2009/0166693 | A1* | 7/2009 | Kim .................. H01L 27/14603 257/292 |

FOREIGN PATENT DOCUMENTS

| JP | H05-291553 A | 11/1993 |
| JP | H06-338524 A | 12/1994 |
| JP | 2000-165755 A | 6/2000 |
| JP | 2006-086241 A | 3/2006 |
| JP | 2006-120966 A | 5/2006 |
| JP | 2008-258571 A | 10/2008 |
| JP | 2009-043791 A | 2/2009 |
| JP | 2011-003716 A | 1/2011 |
| JP | 2011-258613 A | 12/2011 |

* cited by examiner

*Primary Examiner* — Marc Armand
*Assistant Examiner* — Sue Tang
(74) *Attorney, Agent, or Firm* — Oliff PLC

(57) ABSTRACT

An aspect of the invention is a solid-state image capturing device that includes a P-type well 12, an N-type low concentration diffusion layer 18 formed in the P-type well 12, a P-type surface diffusion layer 16 formed on a surface of the N-type low concentration diffusion layer 18, and a P-type high concentration well 15 formed in a boundary region between a side surface of the N-type low concentration diffusion layer 18 and the P-type well 12.

10 Claims, 13 Drawing Sheets

(Cross-sectional view taken along line a-a')

(Cross-sectional view taken along line b-b')

(Planar layout diagram)

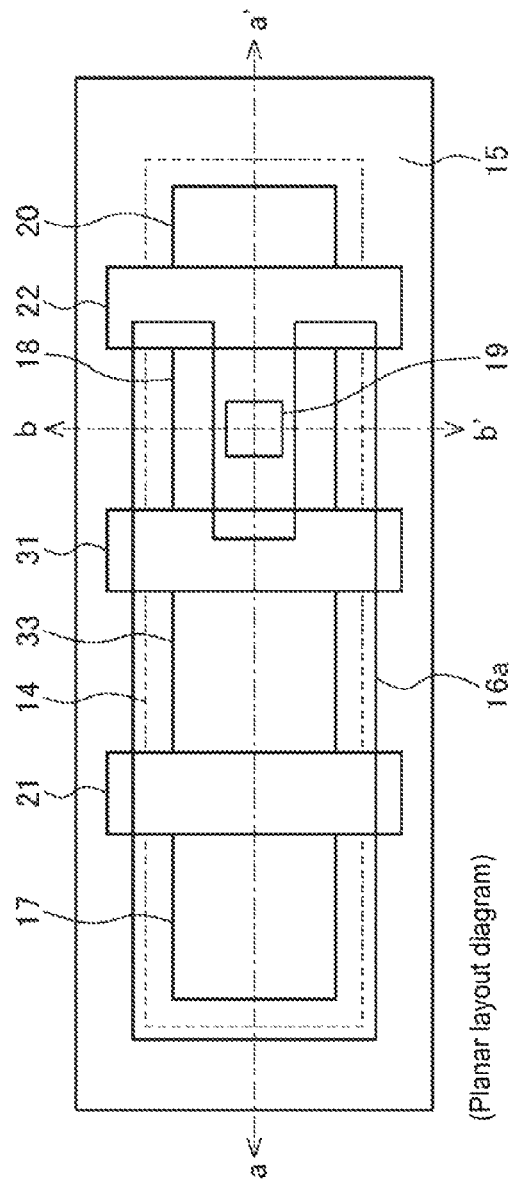
FIG. 5A (Planar layout diagram)
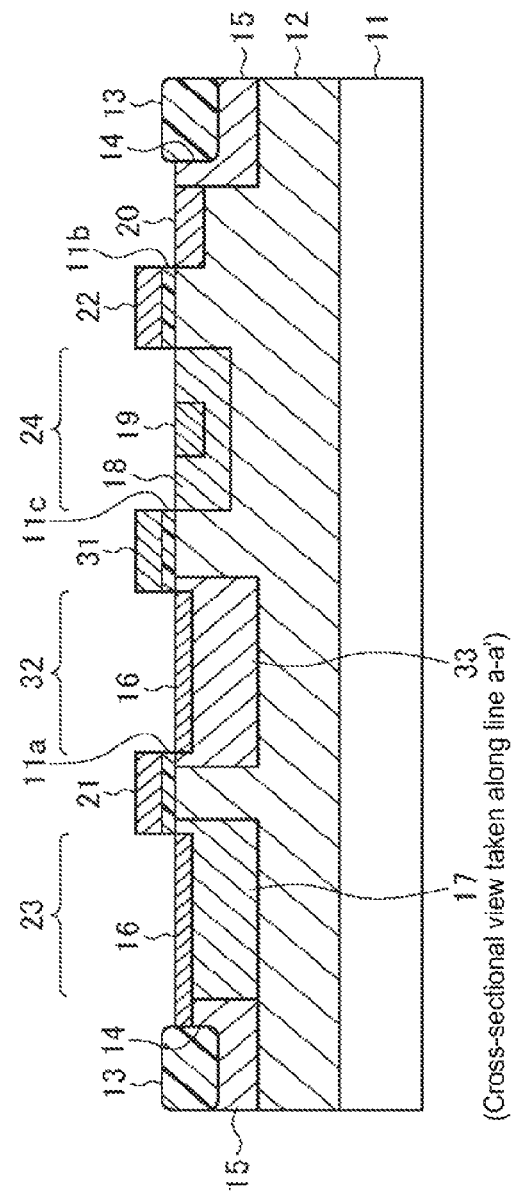
FIG. 5B (Cross-sectional view taken along line a-a')

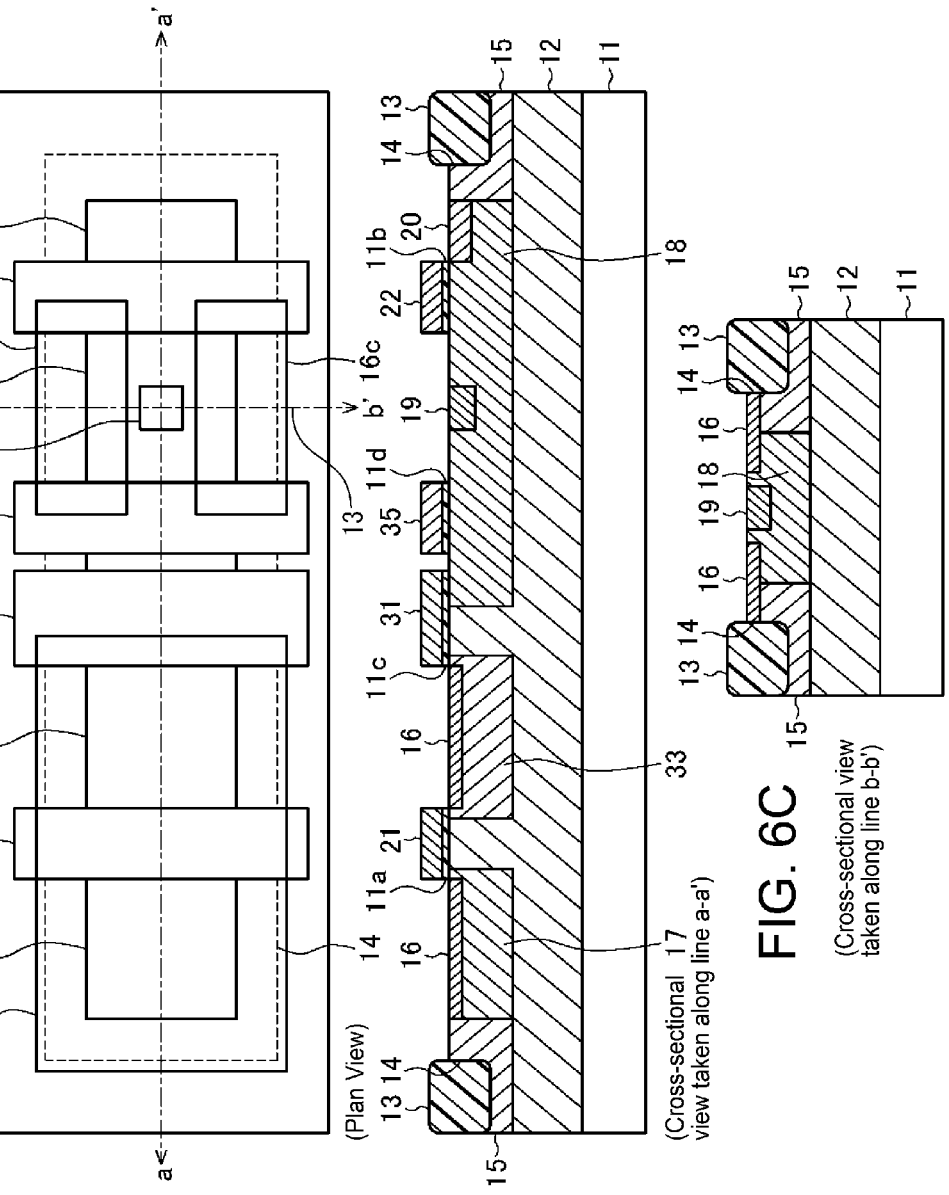

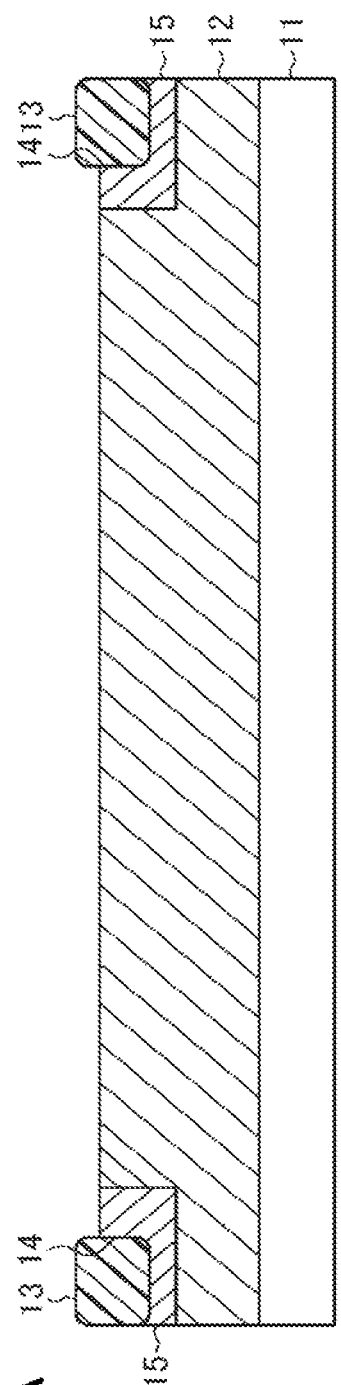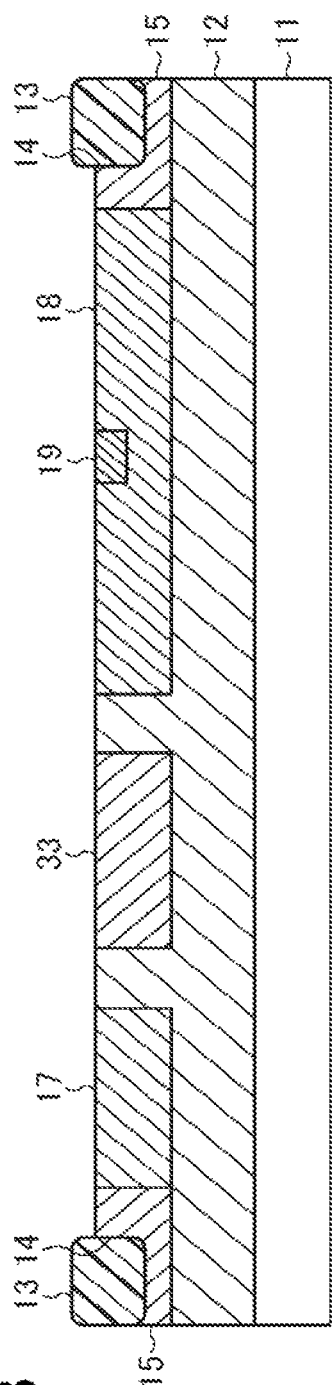

(Cross-sectional view taken along line b-b')

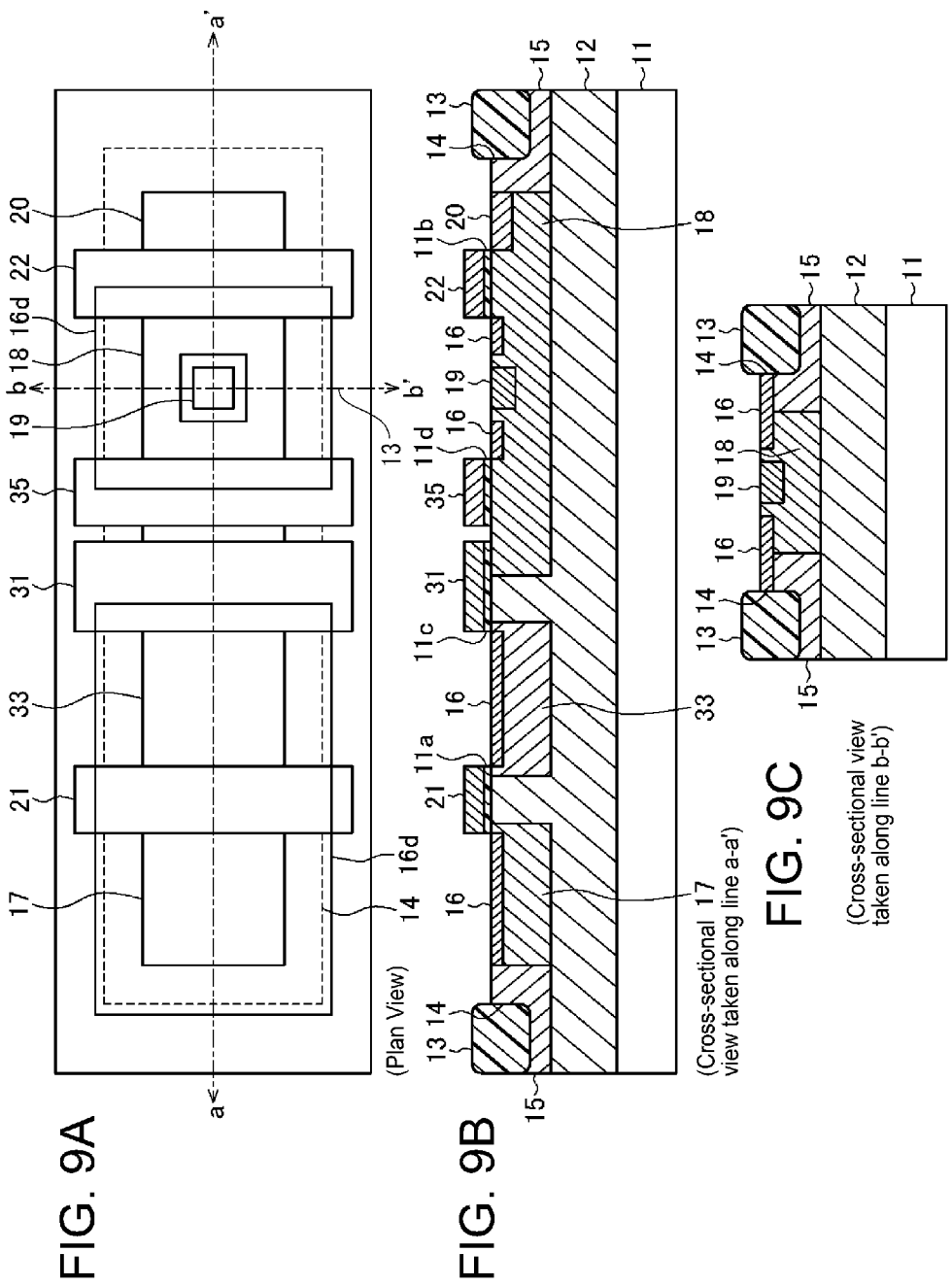

SOLID-STATE IMAGE CAPTURING DEVICE AND MANUFACTURING METHOD THEREOF

BACKGROUND

1. Technical Field

The present invention relates to a solid-state image capturing device and a manufacturing method thereof.

2. Related Art

In a conventional solid-state image capturing device, carriers generated in a photodiode due to photoelectric conversion are transferred via a transfer path to a floating diffusion layer in which the carriers are temporarily accumulated (refer to JP-A-6-338524, for example).

In the above solid-state image capturing device, a larger transfer path width is desirable in order to efficiently transfer the carriers generated in the photodiode due to photoelectric conversion to the floating diffusion layer. On the other hand, in order to increase a conversion gain with which the electric charge of the carriers generated due to photoelectric conversion is converted to a voltage in the floating diffusion layer, a smaller capacitance (cross-sectional area) of the floating diffusion layer is desirable, and thus, the transfer path width needs to be small. Therefore, it has been difficult to reduce the capacitance of the floating diffusion layer while increasing the transfer path width.

SUMMARY

Some aspects of the invention are directed to a solid-state image capturing device in which capacitance of a floating diffusion layer can be reduced regardless of a transfer path width, and a manufacturing method thereof.

An aspect of the invention is directed to a solid-state image capturing device including: a first 1st-conductivity type well; a first 2nd-conductivity type diffusion layer formed in the first 1st-conductivity type well; a 1st-conductivity type diffusion layer formed on a surface of the first 2nd-conductivity type diffusion layer; and a second 1st-conductivity type well formed in a boundary region between a side surface of the first 2nd-conductivity type diffusion layer and the first 1st-conductivity type well.

According to the aspect of the invention, by forming the 1st-conductivity type diffusion layer and the second 1st-conductivity type well in the first 2nd-conductivity type diffusion layer, the capacitance of the first 2nd-conductivity type diffusion layer can be reduced regardless of a transfer path width.

Also, in an aspect of the invention, the solid-state image capturing device further includes: a first electrode formed on a surface of the first 1st-conductivity type well via a first insulating film; and a second 2nd-conductivity type diffusion layer formed in the first 1st-conductivity type well. The first 2nd-conductivity type diffusion layer is connected to the second 2nd-conductivity type diffusion layer by the first electrode. Accordingly, the capacitance of the first 2nd-conductivity type diffusion layer can be reduced regardless of a transfer path width.

Also, in an aspect of the invention, the solid-state image capturing device further includes: a second electrode formed on a surface of the first 1st-conductivity type well via a second insulating film; and a third 2nd-conductivity type diffusion layer formed in the first 1st-conductivity type well. The first 2nd-conductivity type diffusion layer is connected to the third 2nd-conductivity type diffusion layer by the second electrode.

Also, in an aspect of the invention, an element isolation film is formed on a surface of the first 1st-conductivity type well, the element isolation film being located between the first electrode and the second electrode, the first 2nd-conductivity type diffusion layer located between the first electrode and the second electrode is located between two opposing sides of the element isolation film, the second 1st-conductivity type well is formed under the element isolation film, and the 1st-conductivity type diffusion layer is formed, in an element region, on the element isolation film side.

According to the aspect of the invention, since the 1st-conductivity type diffusion layer is formed in an element region on the element isolation film side, the capacitance of the first 2nd-conductivity type diffusion layer can be reduced.

Also, in an aspect of the invention, the second 1st-conductivity type well is formed, in an element region, on the element isolation film side, and the 1st-conductivity type diffusion layer is connected to the second 1st-conductivity type well. As a result of the 1st-conductivity type diffusion layer being connected to the second 1st-conductivity type well as describe above, the capacitance of the first 2nd-conductivity type diffusion layer can be further reduced.

Also, in an aspect of the invention, the respective concentrations of the 1st-conductivity type diffusion layer and the second 1st-conductivity type well are higher than the concentration of the first 1st-conductivity type well. As a result of the concentration of the second 1st-conductivity type well is made higher than the concentration of the first 1st-conductivity type well, an element isolation function can be improved.

Also, in an aspect of the invention, a width of the first 2nd-conductivity type diffusion layer in parallel to a longitudinal direction of a side surface of the second electrode that opposes the first electrode is larger on the second electrode side than on the first electrode side. Accordingly, carrier transfer can be facilitated.

Also, in an aspect of the invention, a width of the 1st-conductivity type diffusion layer in parallel to a longitudinal direction of a side surface of the second electrode that opposes the first electrode is smaller on the second electrode side than on the first electrode side. Accordingly, carrier transfer can be facilitated.

Also, in an aspect of the invention, the solid-state image capturing device further includes: a third electrode formed on a surface of the first 1st-conductivity type well via a third insulating film, and a fourth 2nd-conductivity type diffusion layer formed in the first 1st-conductivity type well. The second 2nd-conductivity type diffusion layer is connected to the fourth 2nd-conductivity type diffusion layer by the third electrode.

According to the aspect of the invention, as a result of temporarily accumulating carriers in the second 2nd-conductivity type diffusion layer, time for performing other processing such as read out processing can be secured, and operation of a global electronic shutter and control of resolution can be facilitated.

Also, in an aspect of the invention, the solid-state image capturing device further includes: a fourth electrode formed on a surface of the first 2nd-conductivity type diffusion layer via a fourth insulating film. The fourth electrode is located adjacent to the first electrode.

According to the aspect of the invention, as a result of fixing the potential of the fourth electrode to the ground potential, a barrier can be formed by the fourth electrode when carriers are transferred to the first 2nd-conductivity type diffusion layer.

An aspect of the invention is directed to a manufacturing method of a solid-state image capturing device including: forming a second 1st-conductivity type well in a first 1st-conductivity type well; forming a first 2nd-conductivity type diffusion layer and a second 2nd-conductivity type diffusion layer in the first 1st-conductivity type well; forming a first electrode on a surface of the first 1st-conductivity type well via a first insulating film; and forming a 1st-conductivity type diffusion layer on surfaces of the first 2nd-conductivity type diffusion layer and the second 2nd-conductivity type diffusion layer in a self-aligned manner with respect to the first electrode. The first 2nd-conductivity type diffusion layer is connected to the second 2nd-conductivity type diffusion layer by the first electrode, and the second 1st-conductivity type well is formed in a boundary region between a side surface of the first 2nd-conductivity type diffusion layer and the first 1st-conductivity type well. Note that forming the 1st-conductivity type diffusion layer in a self-aligned manner with respect to the first electrode means that the 1st-conductivity type diffusion layer is formed by ion-implanting impurities using a portion or whole of the first electrode as a mask.

According to the aspect of the invention, by forming the 1st-conductivity type diffusion layer in the first 2nd-conductivity type diffusion layer at the same time of forming the 1st-conductivity type diffusion layer in the second 2nd-conductivity type diffusion layer, the manufacturing process can be simplified and the manufacturing cost can be reduced.

Also, in an aspect of the invention, the concentration of the 1st-conductivity type diffusion layer is higher than the concentration of the first 1st-conductivity type well.

BRIEF DESCRIPTION OF THE DRAWINGS

The invention will be described with reference to the accompanying drawings, wherein like numbers reference like elements.

FIG. 5A is a plan view illustrating a solid-state image capturing device according to an aspect of the invention. FIG. 5B is a cross-sectional view taken along line a-a' in FIG. 5A.

FIG. 6A is a plan view illustrating a solid-state image capturing device according to an aspect of the invention. FIG. 6B is a cross-sectional view taken along line a-a' in FIG. 6A. FIG. 6C is a cross-sectional view taken along line b-b' in FIG. 6A.

FIGS. 7A and 7B are cross-sectional views for describing a manufacturing method of the solid-state image capturing device shown in FIGS. 6A to 6C.

FIG. 9A is a plan view illustrating a solid-state image capturing device according to an aspect of the invention. FIG. 9B is a cross-sectional view taken along line a-a' in FIG. 9A. FIG. 9C is a cross-sectional view taken along line b-b' in FIG. 9A.

DESCRIPTION OF EXEMPLARY EMBODIMENTS

Hereinafter, embodiments of the invention will be described in detail with reference to the drawings. However, the invention is not limited to the following description, and it can be easily understood by a person skilled in the art that various changes may be made to the form and the details of the invention without departing from the spirit and scope of the invention. Therefore, the invention is not to be construed as being limited to the following description of the embodiments.

Embodiment 1

Figure 1B:
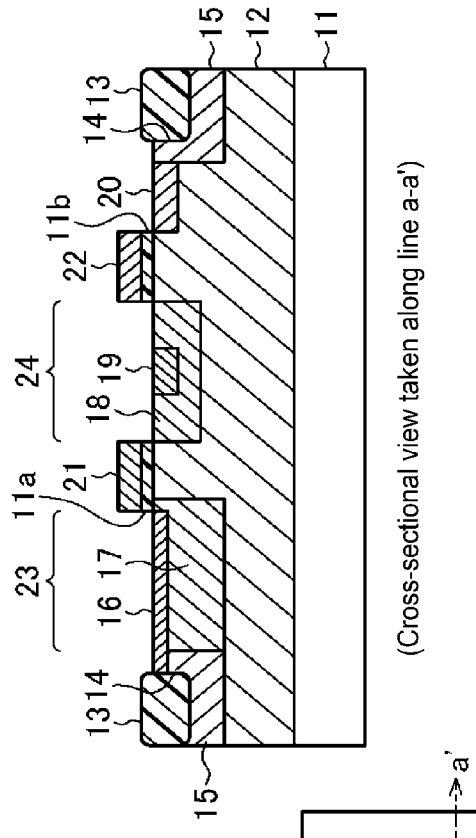
FIG. 1B is a cross-sectional view taken along line a-a' in FIG. 1A.
Figure 1C:
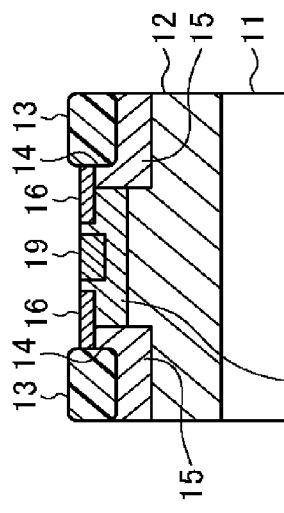
FIG. 1C is a cross-sectional view taken along line b-b' in FIG. 1A.
Figure 1A:
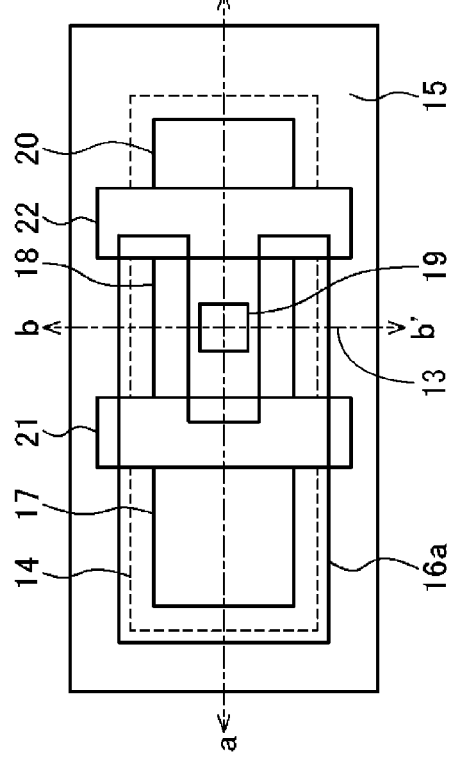
FIG. 1A is a plan view illustrating a solid-state image capturing device according to an aspect of the invention.

FIG. 1A is a plan view illustrating a solid-state image capturing device according to an aspect of the invention, FIG. 1B is a cross-sectional view taken along line a-a' in FIG. 1A, and FIG. 1C is a cross-sectional view taken along line b-b' in FIG. 1A.

A P-type well 12 is formed in an N-type silicon substrate 11 serving as a semiconductor substrate, and a LOCOS oxide film 13 serving as an element isolation film is formed in the P-type well 12. An active region 14 is formed surrounded by the LOCOS oxide film 13. A P-type high concentration well 15 is formed under the LOCOS oxide film 13 and in the active region 14 (element region) on the LOCOS oxide film 13 side. The P-type high concentration well 15 is a well having a higher concentration than the P-type well 12. Accordingly, the P-type high concentration well 15 can also serve as a well for forming an isolation region of a pixel, and the element isolation function can be improved. Note that although the LOCOS oxide film 13 is used as the element isolation film in the present embodiment, the element isolation film is not limited thereto, and another element isolation film such as a trench element isolation film can also be used.

An N-type accumulation layer 17 is formed in a portion of the P-type well 12 that is located between portions of the P-type high concentration well 15. The N-type accumulation layer 17 is for accumulating carriers generated due to photoelectric conversion, and constitutes a portion of a photoelectric conversion element (photodiode) 23.

A transfer gate electrode (hereinafter also referred to as "transfer electrode") 21 is formed on a surface of the P-type well 12 via a gate insulating film 11a, and a reset gate electrode (hereinafter also referred to as "reset electrode") 22 is formed on a surface of the P-type well 12 via a gate insulating film 11b.

An N-type low concentration diffusion layer 18 is formed in a portion of the P-type well 12 that is located between portions of the P-type high concentration well 15, and the N-type low concentration diffusion layer 18 is located between the transfer electrode 21 and the reset electrode 22. The N-type low concentration diffusion layer 18 is formed in a self-aligned manner with respect to portions of the LOCOS oxide film 13 that are located between the transfer electrode 21 and the reset electrode 22, the transfer electrode 21, and the reset electrode 22. An N-type medium concentration diffusion layer 19 is formed on a surface of the N-type low concentration diffusion layer 18, and an N-type floating diffusion layer 24 is formed by the N-type low concentration diffusion layer 18 and the N-type medium concentration diffusion layer 19. That is, the N-type floating diffusion layer 24 is located between two opposing sides of the LOCOS oxide film 13, and is located between the transfer electrode 21 and the reset electrode 22.

The N-type floating diffusion layer 24 is connected to the N-type accumulation layer 17 by the transfer electrode 21. That is, a transfer transistor is constituted by the transfer electrode 21, the N-type accumulation layer 17, and the N-type floating diffusion layer 24, carriers generated due to photoelectric conversion are accumulated in the N-type accumulation layer 17 of the photoelectric conversion element 23, and the carriers generated due to photoelectric conversion are transferred to the N-type floating diffusion layer 24 under the control of the transfer electrode 21.

An N-type high concentration diffusion layer 20 is formed in a portion of the P-type well 12 that is located between portions of the P-type high concentration well 15, and the N-type high concentration diffusion layer 20 is formed in a self-aligned manner with respect to the reset electrode 22. The depths of the bottom surfaces of the N-type high concentration diffusion layer 20, the N-type low concentration diffusion layer 18, and the N-type accumulation layer 17 increase in the stated order (refer to FIG. 1B).

The reset electrode 22 is located between the N-type floating diffusion layer 24 and the N-type high concentration diffusion layer 20, and controls electrical connection therebetween. That is, a reset transistor is constituted by the reset electrode 22, the N-type floating diffusion layer 24, and the N-type high concentration diffusion layer 20, and the carriers temporarily accumulated in the N-type floating diffusion layer 24 is discharged to the N-type high concentration diffusion layer 20 under the control of the reset electrode 22.

A P-type surface diffusion layer 16 is formed on a surface of the N-type accumulation layer 17 and on a surface of the portion of the P-type high concentration well 15 that is located adjacent to the N-type accumulation layer 17. The concentration of the P-type surface diffusion layer 16 is higher than the concentration of the P-type well 12. The P-type surface diffusion layer 16 acts as a pinning layer that is provided to suppress a dark current generated by thermally excited carriers, irrespective of incident light, in the photoelectric conversion element 23.

Also, the P-type surface diffusion layers 16 are formed on the surface of the N-type low concentration diffusion layer 18, and are continuously formed from the transfer electrode 21 side to the reset electrode 22 side. The P-type surface diffusion layers 16 are formed by ion implantation using the transfer electrode 21, the reset electrode 22, the LOCOS oxide film 13, and a resist mask (not shown) as the mask. The opening region 16a of the resist mask is shown in FIG. 1A. The P-type surface diffusion layers 16 are formed in the active region 14 (element region) on the LOCOS oxide film 13 side. The P-type surface diffusion layers 16 are electrically connected to the P-type high concentration well 15, and the P-type high concentration well 15 is electrically connected to the P-type well 12. Accordingly, surface potential can be made substantially equal to the potential of the P-type well 12.

Also, by forming the P-type surface diffusion layers 16 formed on the surface of the N-type low concentration diffusion layer 18 and the P-type surface diffusion layer 16 formed on the surface of the N-type accumulation layer 17 in the same ion implantation process, the manufacturing process can be simplified and reduction in the manufacturing cost can be realized.

The P-type high concentration well 15 is formed in a boundary region between a side surface of the N-type low concentration diffusion layer 18 in the N-type floating diffusion layer 24 and the P-type well 12, and is not formed under the bottom surface of the N-type low concentration diffusion layer 18, as shown in FIG. 1C.

Portions of the P-type high concentration well 15 are, individually, continuously formed in end portions of the active region 14 of the transfer transistor in a channel width direction, end portions of the active region 14 of the reset transistor in a channel width direction, and end portions of the active region 14 of the N-type floating diffusion layer 24 in a direction orthogonal to a carrier transfer direction.

The P-type surface diffusion layers 16 individually include end portions of the active region 14 of the transfer transistor in a channel width direction, end portions of the active region 14 of the reset transistor in a channel width direction, and end portions of the active region 14 of the N-type floating diffusion layer 24 in a direction orthogonal to a carrier transfer direction, and extend close to the N-type medium concentration diffusion layer 19.

According to the present embodiment, as a result of the N-type floating diffusion layer 24 being located between the two P-type surface diffusion layers 16 having opposite conductivity and between two portions of the P-type high concentration well 15 having opposite conductivity, as shown in FIG. 1C, peripheral regions of a carrier accumulation region of the N-type floating diffusion layer 24 can be depleted, and the capacitance of the carrier accumulation region can be reduced. Accordingly, the capacitance of the N-type floating diffusion layer 24 can be reduced, without sacrificing transfer efficiency (regardless of the transfer path width).

That is to say, even if the transfer path width is made large and the transfer efficiency is increased, as a result of the N-type floating diffusion layer 24 being located between the two P-type surface diffusion layers 16 and between two portions of the P-type high concentration well 15, the peripheral regions of the carrier accumulation region of the N-type floating diffusion layer 24 can be depleted, and the capacitance of the carrier accumulation region can be reduced. Accordingly, the conversion gain in converting the electric charge of the carriers generated due to photoelectric conversion into voltage can be increased.

Figure 2:
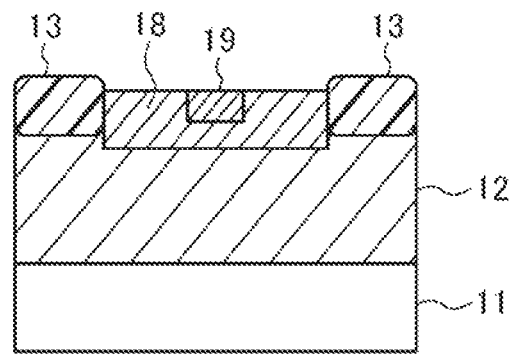
FIG. 2 is a cross-sectional view of the same portion shown in FIG. 1C in which a P-type surface diffusion layer 16 and a P-type high concentration well 15 are not formed in an N-type low concentration region 18 of an N-type floating diffusion layer.

The above effect will be described in more detail. FIG. 2 is a cross-sectional view of the same portion shown in FIG. 1C in which the P-type surface diffusion layer 16 and the P-type high concentration well 15 are not formed in the N-type low concentration region 18 of the N-type floating diffusion layer 24.

In the N-type low concentration diffusion layer 18 shown in FIG. 1C, a depletion layer is formed due to the P-type surface diffusion layer 16 and the P-type high concentration well 15. On the other hand, in the N-type low concentration diffusion layer 18 shown in FIG. 2, such a depletion layer is not formed since the P-type surface diffusion layer 16 and the P-type high concentration well 15 do not exist. Accordingly, in the N-type floating diffusion layer 24 shown in FIG. 1C, the capacitance (cross-sectional area) of the carrier accumulation region can be reduced. The relationship between the accumulated amount Q of carriers, the capacitance C of the carrier accumulation region, and the output voltage V is represented as V=Q/C, and as a result, by reducing the capacitance C, even if the number of the carriers accumulated in the carrier accumulation region is the same, the output voltage V can be increased. Accordingly, the conversion gain in converting the carriers generated due to photoelectric conversion into voltage can be increased.

Note that in order to realize the reduction of the capacitance of the N-type floating diffusion layer 24, the respective concentrations of the P-type surface diffusion layer 16 and the P-type high concentration well 15 may not be higher than the concentration of the P-type well 12.

Embodiment 2

Figure 3:
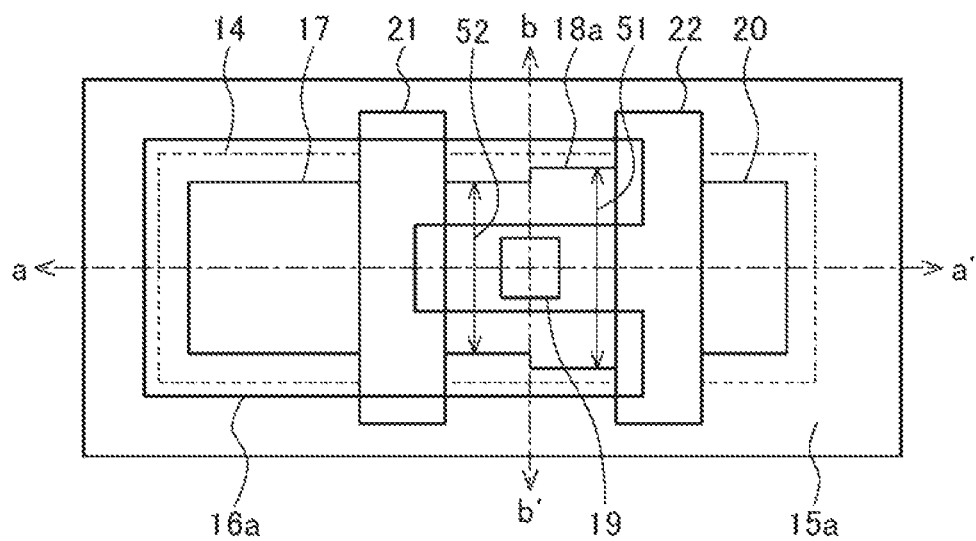
FIG. 3 is a plan view illustrating a solid-state image capturing device according to an aspect of the invention.

FIG. 3 is a plan view illustrating a solid-state image capturing device according to an aspect of the invention, and portions that are similar to those of FIG. 1A are given the same reference signs, and only different portions will be described.

An N-type low concentration diffusion layer 18a of the N-type floating diffusion layer has a larger width 51, in a direction parallel to the longitudinal direction of the side surface of the reset electrode 22 that opposes the transfer electrode 21, on the reset electrode 22 side than a width 52 on the transfer electrode 21 side. That is, since each of the widths 51 and 52 of the N-type low concentration diffusion layer 18a corresponds to the distance between opposing sides, of the P-type high concentration well 15a, that sandwich the N-type low concentration diffusion layer 18a, the width 51 of the N-type low concentration diffusion layer 18a on the reset electrode 22 side can be increased compared with the width 52 of the N-type low concentration diffusion layer 18a on the transfer electrode 21 side by making the distance between opposing sides of the P-type high concentration well 15a on the reset electrode 22 side wider than on the transfer electrode 21 side, in the present embodiment.

The same effects as those in Embodiment 1 can also be obtained in the present embodiment. Also, by making the width, from an edge of the active region 14, of the region where the P-type high concentration well 15a is formed smaller toward the reset transistor from the transfer transistor, the region (cross-sectional area) to be depleted in the N-type low concentration diffusion layer 18a in the N-type floating diffusion layer can be increased. As a result, a potential profile for facilitating flow of carriers can be formed. Accordingly, carrier transfer can be facilitated.

Embodiment 3

Figure 4:
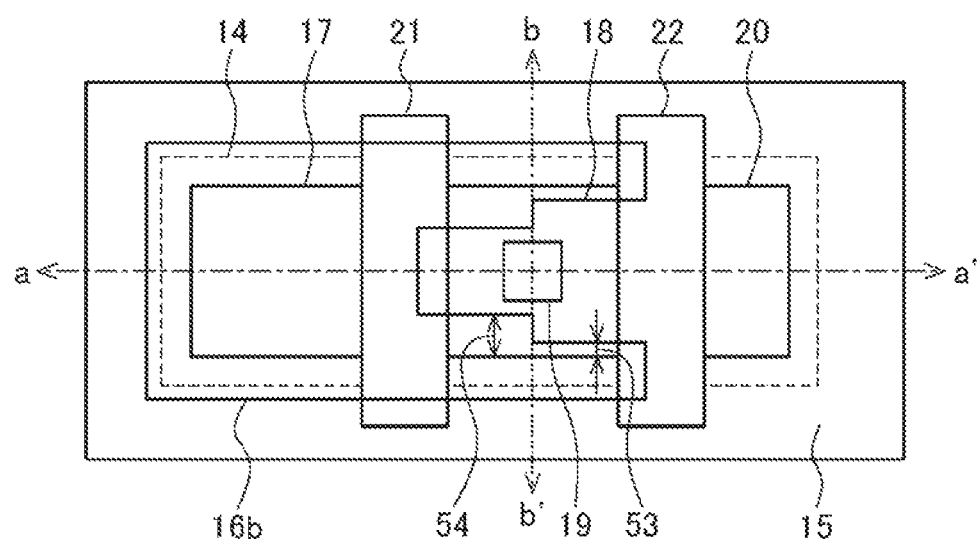
FIG. 4 is a plan view illustrating a solid-state image capturing device according to an aspect of the invention.

FIG. 4 is a plan view illustrating a solid-state image capturing device according to an aspect of the invention, and portions that are similar to those of FIG. 1A are given the same reference signs, and only different portions will be described.

A P-type surface diffusion layer has a narrower width 53, in a direction parallel to the longitudinal direction of the side surface of the reset electrode 22 that opposes the transfer electrode 21, on the reset electrode 22 side than a width 54 on the transfer electrode 21 side. Accordingly, the width of the N-type low concentration diffusion layer 18 located between the P-type surface diffusion layers can be made larger on the reset electrode 22 side than on the transfer electrode 21 side.

The P-type surface diffusion layer is formed by ion implantation using the transfer electrode 21, the reset electrode 22, the LOCOS oxide film 13, and a resist mask (not shown) as the mask. The opening region 16b of the resist mask is shown in FIG. 4.

The same effects as those in Embodiment 1 can also be obtained in the present embodiment. Also, by making the width, from an edge of the active region 14, of the region where the P-type surface diffusion layer is formed smaller toward the reset transistor from the transfer transistor, the region (cross-sectional area) to be depleted in the N-type low concentration diffusion layer 18 in the N-type floating diffusion layer can be increased. As a result, a potential profile for facilitating flow of carriers can be formed. Accordingly, carrier transfer can be facilitated.

Embodiment 4

FIG. 5A is a plan view illustrating a solid-state image capturing device according to an aspect of the invention, FIG. 5B is a cross-sectional view taken along line a-a' in FIG. 5A, and portions that are similar to those of FIG. 1A are given the same reference signs, and only different portions will be described.

The solid-state image capturing device according to the present embodiment differs from Embodiment 1 in that a temporary carrier accumulation layer 32 and a transfer electrode 31 are arranged between the transfer electrode 21 and the N-type floating diffusion layer 24. That is, the transfer electrode 31 is formed on a surface of the P-type well 12 via a gate insulating film 11c, and an N-type accumulation layer 33 for temporarily accumulating carriers is formed in the P-type well 12. A P-type surface diffusion layer 16 is formed on a surface of the N-type accumulation layer 33.

The transfer electrode 21 is located between the N-type accumulation layer 33 and the N-type accumulation layer 17, and controls electrical connection therebetween. The transfer electrode 31 is located between the N-type accumulation layer 33 and the N-type floating diffusion layer 24, and controls electrical connection therebetween. That is, a transfer transistor is constituted by the transfer electrode 21, the N-type accumulation layer 17, and the N-type accumulation layer 33. Carriers generated due to photoelectric conversion are accumulated in the N-type accumulation layer 17 of the photoelectric conversion element 23, and the carriers generated due to photoelectric conversion are transferred to the N-type accumulation layer 33 by the control of the transfer electrode 21. Also, a transfer transistor is constituted by the transfer electrode 31, the N-type floating diffusion layer 24, and the N-type accumulation layer 33, and the carriers temporarily accumulated in the N-type accumulation layer 33 are transferred to the N-type floating diffusion layer 24 by the control of the transfer electrode 31.

The same effects as those in Embodiment 1 can also be obtained in the present embodiment.

Also, as a result of temporarily accumulating carriers in the N-type accumulation layer 33, time for performing other processing such as read out processing can be secured, and operation of a global electronic shutter and control of resolution can be facilitated.

Embodiment 5

FIG. 6A is a plan view illustrating a solid-state image capturing device according to an aspect of the invention, FIG. 6B is a cross-sectional view taken along line a-a' in FIG. 6A, and FIG. 6C is a cross-sectional view taken along line b-b' in FIG. 6A. Portions that are similar to those of FIGS. 5A and 5B are given the same reference signs, and only different portions will be described.

The solid-state image capturing device according to the present embodiment differs from Embodiment 1 in that a barrier electrode 35 is formed on a surface of the N-type low concentration diffusion layer 18 of the N-type floating diffusion layer via an insulating film 11d, and the barrier electrode 35 is located adjacent to the transfer electrode 31.

In the present embodiment, a barrier can be formed by fixing the potential of the barrier electrode 35 to the ground potential (GND) when carriers temporarily accumulated in the N-type accumulation layer 33 are transferred to the N-type floating diffusion layer 24 due to the function of the transfer electrode 31. Accordingly, high speed processing for shortening a read out time or the like is facilitated, and noise can be reduced.

FIGS. 7A, 7B, 8A, 8B, and 8C are cross-sectional views for describing a manufacturing method of the solid-state image capturing device shown in FIGS. 6A, 6B, and 6C.

First, as shown in FIG. 7A, the LOCOS oxide film 13 is formed on the N-type silicon substrate 11. Accordingly, the active region 14 is formed in a region that is surrounded by the LOCOS oxide film 13. Next, the P-type well 12 is formed by ion-implanting impurities in the N-type silicon substrate 11. Next, the P-type high concentration well 15 is formed by ion-implanting impurities in the P-type well 12. The P-type high concentration well 15 also functions as an isolation region.

Next, as shown in FIG. 7B, the N-type accumulation layers 17 and 33, and the N-type low concentration diffusion layer 18 and the N-type medium concentration diffusion layer 19 of the N-type floating diffusion layer are formed by ion-implanting impurities into the P-type well 12.

Figure 8A:
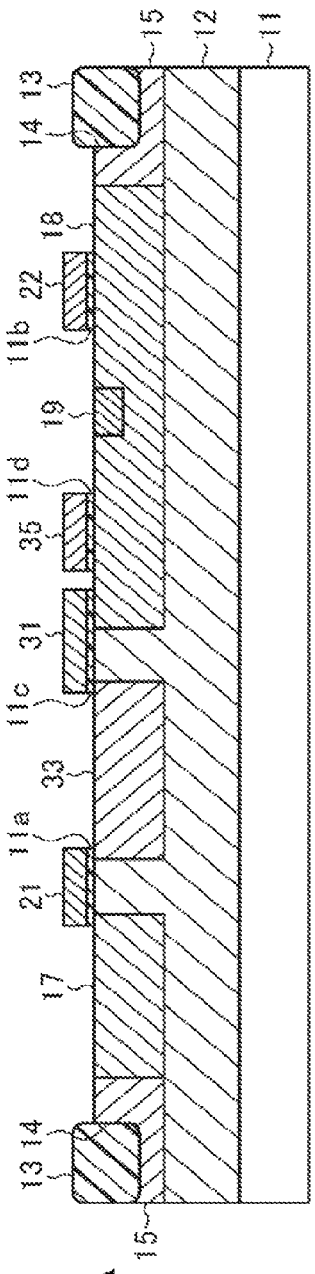
FIGS. 8A to 8C are cross-sectional views for describing the manufacturing method of the solid-state image capturing device shown in FIGS. 6A to 6C.

Subsequently, as shown in FIG. 8A, a gate oxide film that is to be the gate insulating films 11a, 11b, 11c, and 11d is formed on a surface of the N-type silicon substrate 11 by thermally oxidizing the surface of the N-type silicon substrate 11. Next, a polysilicon film is formed on the gate oxide film, and the polysilicon film is patterned by a photolithography technique and a dry etching technique. Accordingly, the transfer electrode 21 is formed on the gate insulating film 11a, the reset electrode 22 is formed on the gate insulating film 11b, the transfer electrode 31 is formed on the gate insulating film 11c, and the barrier electrode 35 is formed on the gate insulating film 11d.

Figure 8B:
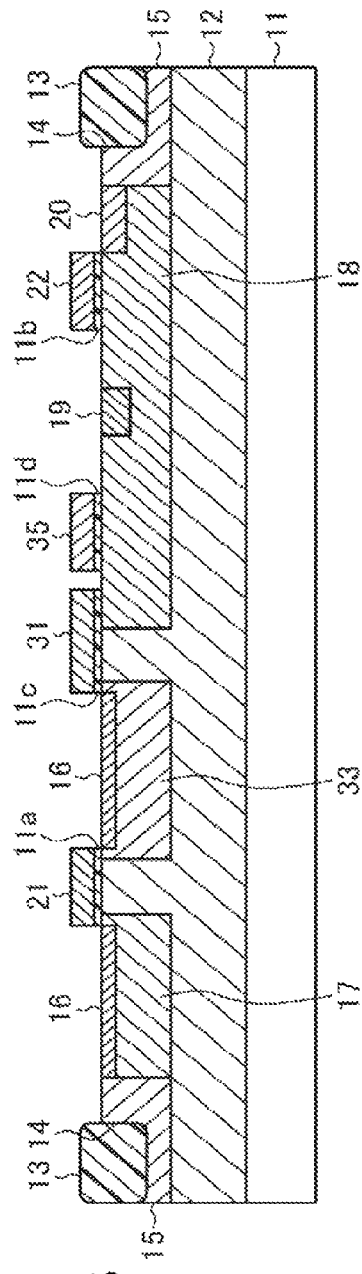
Figure 8C:
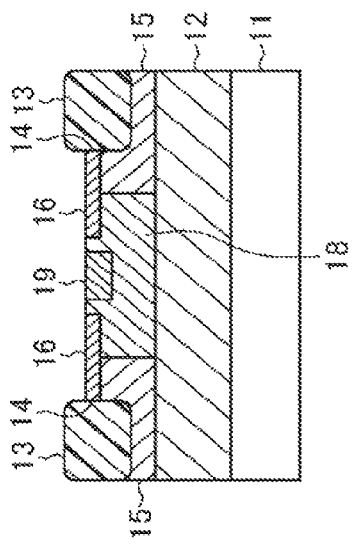

Next, as shown in FIGS. 8B and 8C, the P-type surface diffusion layer 16 is formed by ion-implanting impurities in the N-type accumulation layers 17 and 33 and the N-type low concentration diffusion layer 18, by using the transfer electrodes 21 and 31, the barrier electrode 35, the reset electrode 22, the LOCOS oxide film 13, and a resist mask (not shown) as the mask. The resist mask used at this time has the opening region 16c shown in FIG. 6A.

In the present embodiment, the P-type surface diffusion layers 16 that are formed on the surface of the N-type low concentration diffusion layer 18 and the P-type surface diffusion layers 16, which act also as the pinning layer, that are formed on the surfaces of the N-type accumulation layers 17 and 33 are formed by the same ion implantation process, and as a result, the manufacturing process can be simplified and the manufacturing cost can be reduced.

Embodiment 6

FIG. 9A is a plan view illustrating a solid-state image capturing device according to an aspect of the invention, FIG. 9B is a cross-sectional view taken along line a-a' in FIG. 9A, and FIG. 9C is a cross-sectional view taken along line b-b' in FIG. 9A. Portions that are similar to those of FIGS. 6A to 6C are given the same reference signs, and only different portions will be described.

In the solid-state image capturing device according to the present embodiment, opening regions 16d of the resist mask that is used when the P-type surface diffusion layers 16 are formed are as shown in FIG. 9A, and differ from the opening regions 16c shown in FIG. 6A. That is, in the opening regions 16d of the resist mask shown in FIG. 9A, a region including the N-type medium concentration diffusion layer 19 and surrounding area thereof are not opened. In contrast, in the opening regions 16c of the resist mask shown in FIG. 6A, a region from the barrier electrode 35 to the reset electrode 22 that includes the N-type medium concentration diffusion layer 19 and the surrounding area thereof are not opened.

The same effects as those in Embodiment 5 can also be obtained in the present embodiment.

Embodiment 7

FIGS. 10 to 13 are diagrams for describing a charge transfer operation of the solid-state image capturing device shown in FIGS. 6A to 6C. FIG. 14 is a driving sequence for describing the charge transfer operation of the solid-state image capturing device shown in FIGS. 6A to 6C.

Figure 10:
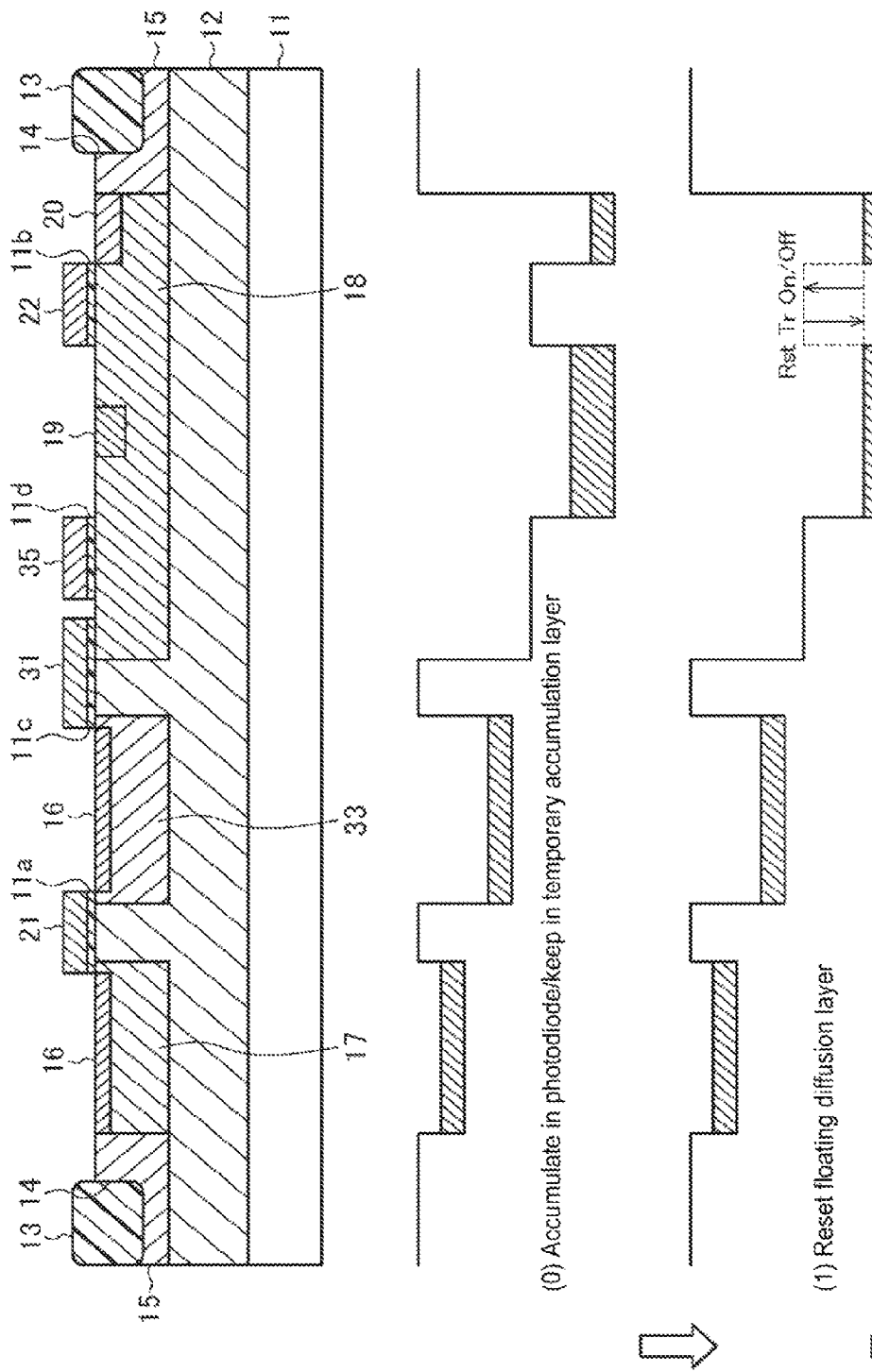
FIG. 10 is a diagram for describing a charge transfer operation of the solid-state image capturing device shown in FIGS. 6A to 6C.

As shown in FIG. 10, charges are accumulated in the photodiode, and the charges are temporarily accumulated in the N-type accumulation layer 33 (0). Next, charges accumulated in the N-type floating diffusion layer are reset by a reset transistor Rst Tr (1). This corresponds to a reset operation of a first pixel shown in FIG. 14.

Figure 11:
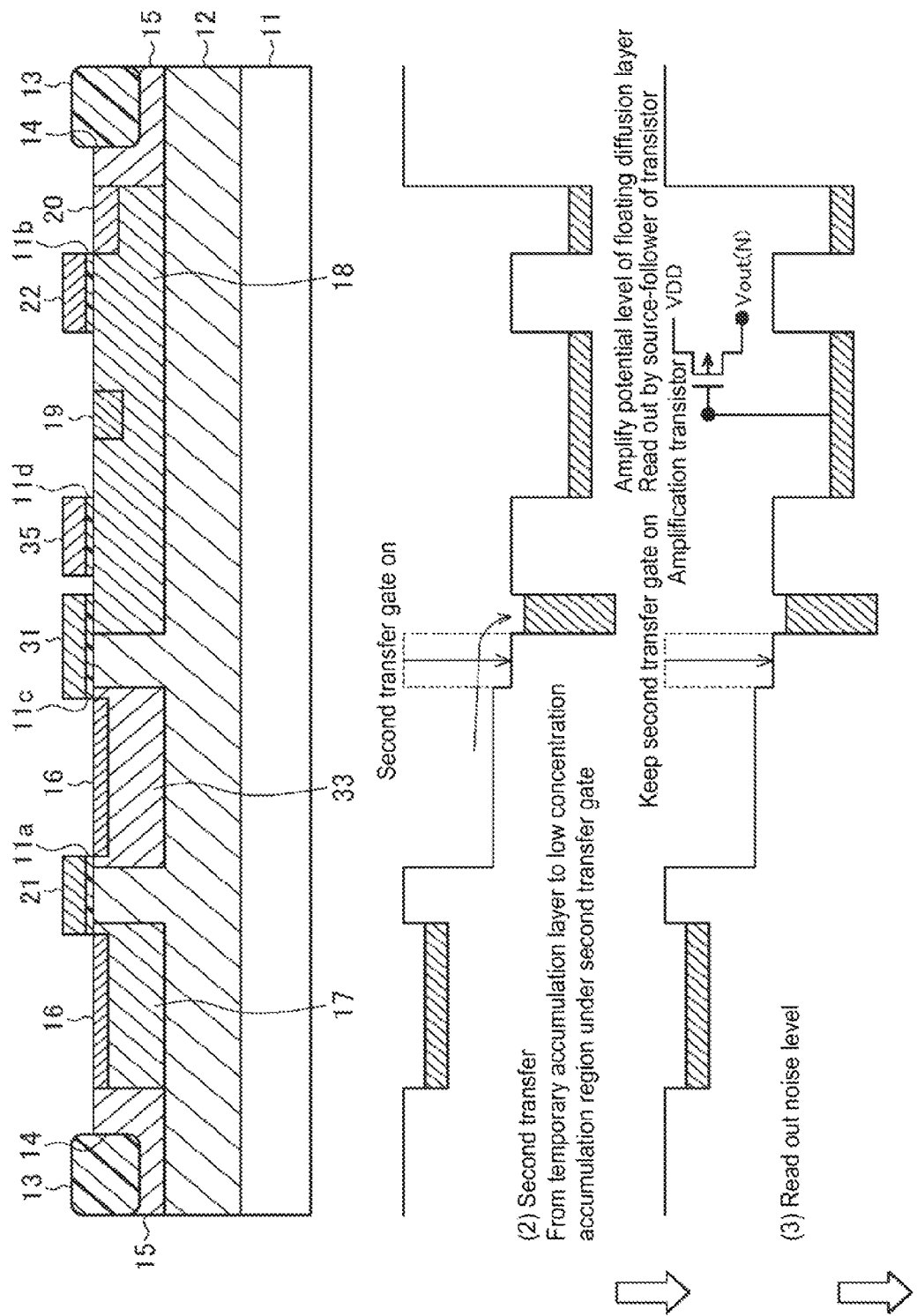
FIG. 11 is a diagram for describing the charge transfer operation of the solid-state image capturing device shown in FIGS. 6A to 6C.

Next, as shown in FIG. 11, by turning on a second transfer gate, the charges accumulated in the N-type accumulation layer 33 are transferred to a low concentration accumulation region of the N-type low concentration diffusion layer 18 formed under the second transfer gate (2). This corresponds to a second transfer operation of the first pixel shown in FIG. 14. Next, while keeping the second transfer gate on, the potential level of the N-type floating diffusion layer is read out by a source follower of an amplification transistor, thus reading out of the noise level is performed (3). This corresponds to noise read out of the first pixel shown in FIG. 14.

Figure 12:
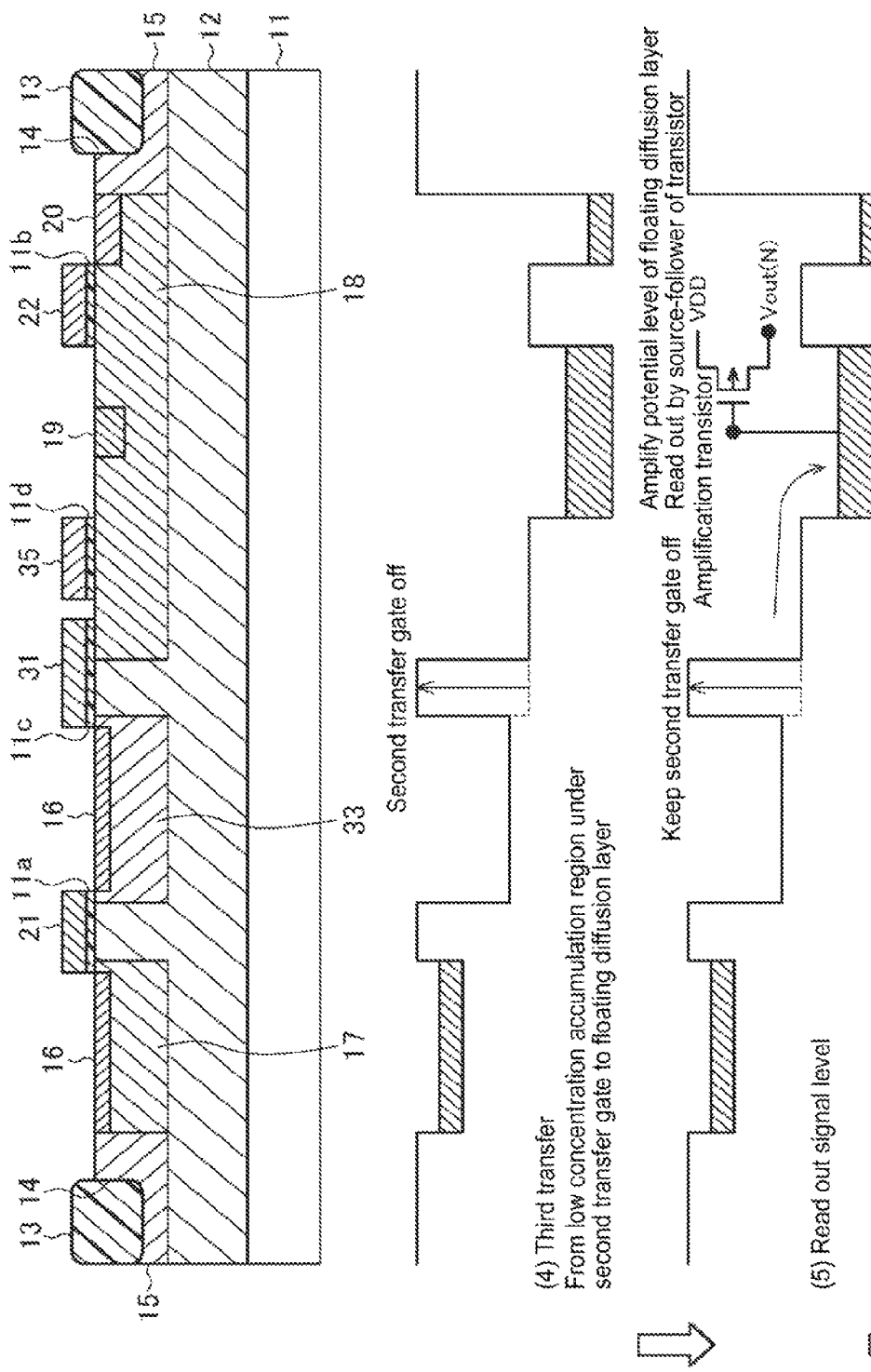
FIG. 12 is a diagram for describing the charge transfer operation of the solid-state image capturing device shown in FIGS. 6A to 6C.

Next, as shown in FIG. 12, by turning off the second transfer gate, the charges in the low concentration accumulation region of the N-type low concentration diffusion layer 18 formed under the second transfer gate are transferred to the N-type low concentration diffusion layer 18 of the N-type floating diffusion layer (4). This corresponds to a third transfer operation of the first pixel shown in FIG. 14.

Next, while keeping the second transfer gate off, the potential level of the N-type floating diffusion layer is read out by the source follower of the amplification transistor, thus reading out of a signal level is performed (5). This corresponds to signal read out of the first pixel shown in FIG. 14.

Figure 13:
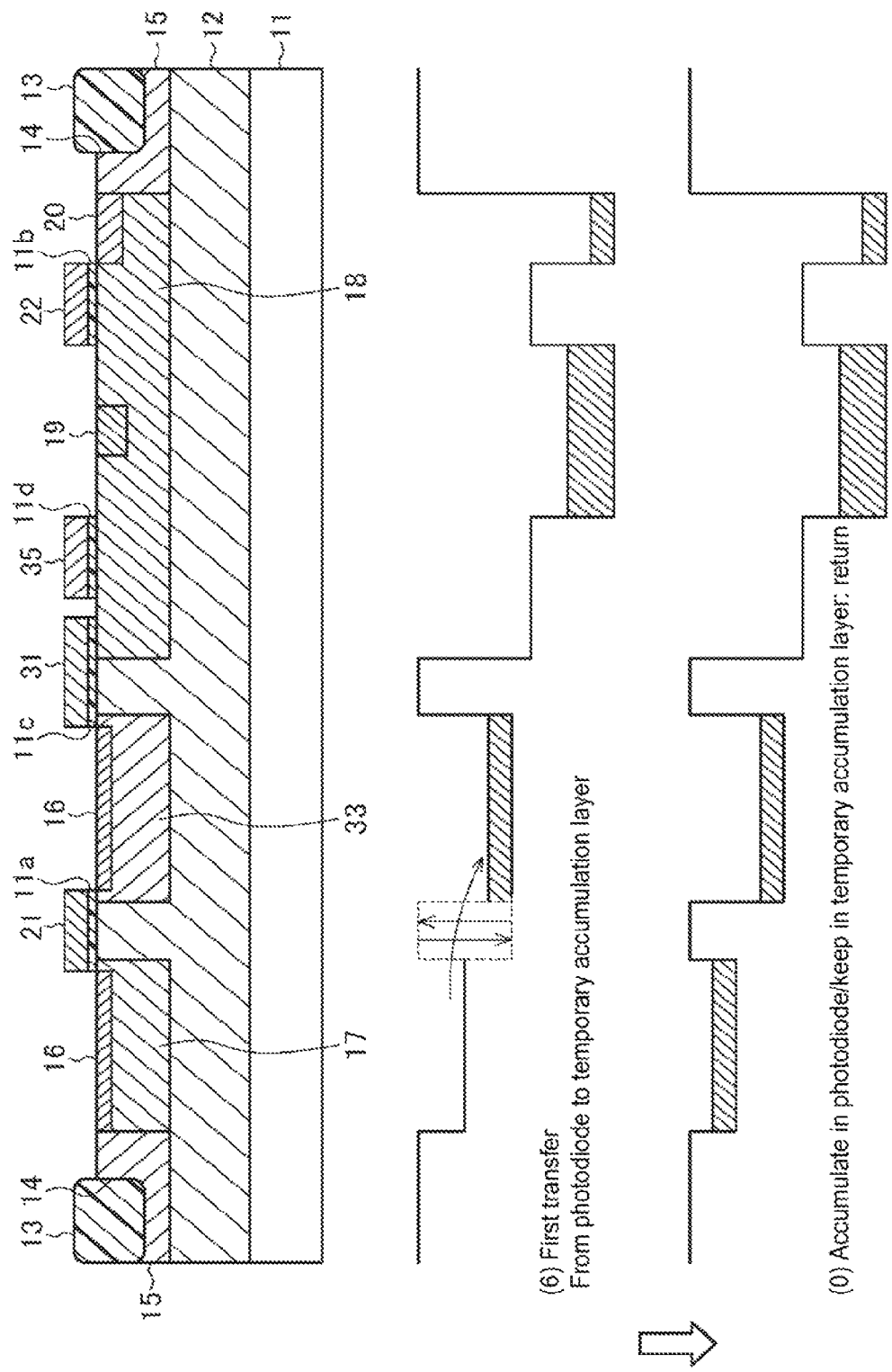
FIG. 13 is a diagram for describing the charge transfer operation of the solid-state image capturing device shown in FIGS. 6A to 6C.
Figure 14:
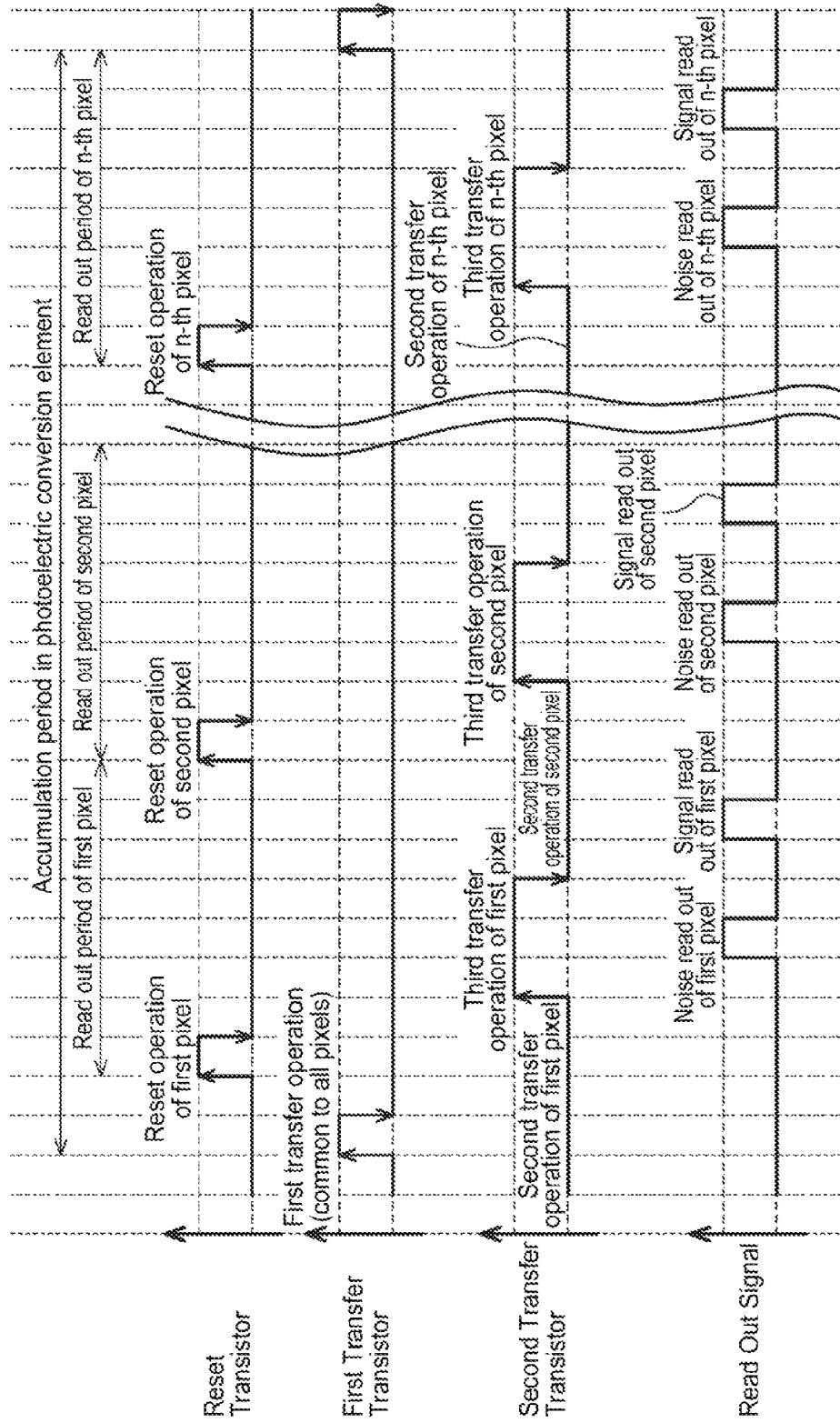
FIG. 14 is a driving sequence diagram for describing the charge transfer operation of the solid-state image capturing device shown in FIGS. 6A to 6C.

Next, as shown in FIG. 13, by sequentially turning on and off a first transfer gate, the charges accumulated in the photodiode are transferred to the N-type accumulation layer 33, which is a temporary accumulation layer (6). Next, charges are accumulated in the photodiode (0).

Note that, in various embodiments of the invention, when a specific B (referred to as "B" below) is located over a specific A (referred to as "A" below) in the invention, the invention is not limited to the case of B being located directly on or under A. Cases in which B is located on A via another object without inhibiting the effect of the invention are also included.

Also, in Embodiments 1 to 7 described above, the P-type well 12 may be read as a first 1st-conductivity type well, the N-type floating diffusion layer 24 may be read as a first 2nd-conductivity type diffusion layer, the P-type surface diffusion layer 16 may be read as a 1st-conductivity type diffusion layer, the P-type high concentration wells 15 and 15a may be read as a second 1st-conductivity type well, the transfer electrode 21 may be read as a first electrode, the N-type accumulation layer 17 may be read as a second 2nd-conductivity type diffusion layer, the reset electrode 22 may be read as a second electrode, the N-type high concentration diffusion layer 20 may be read as a third 2nd-conductivity type diffusion layer, and the LOCOS oxide film 13 may be read as an element isolation film. Also, although the transfer electrode 21 may be read as a third electrode, and the N-type accumulation layer 17 may be read as a fourth 2nd-conductivity type diffusion layer, but in this case, the transfer electrode 31 should be read as a first electrode, and the N-type accumulation layer 33 should be read as a second 2nd-conductivity type diffusion layer. Also, the barrier electrode 35 may be read as a fourth electrode.

Also, Embodiments 1 to 7 described above may be appropriately combined for implementation.

The entire disclosure of Japanese Patent Application No. 2014-175875, filed Aug. 29, 2014 is expressly incorporated by reference herein.

What is claimed is:

1. A solid-state image capturing device comprising:
   a first 1st-conductivity type well;
   a first 2nd-conductivity type diffusion layer formed in the first 1 st-conductivity type well;
   a 1st-conductivity type diffusion layer formed on a surface of the first 2nd-conductivity type diffusion layer;
   a second 1st-conductivity type well formed in a boundary region between a side surface of the first 2nd-conductivity type diffusion layer and the first 1st-conductivity type well;
   a first electrode formed on a surface of the first 1st-conductivity type well via a first insulating film;
   a second 2nd-conductivity type diffusion layer formed in the first 1st-conductivity type well;
   a second electrode formed on a surface of the first 1st-conductivity type well via a second insulating film;
   a third 2nd-conductivity type diffusion layer formed in the first 1st-conductivity type well; and
   an element isolation film formed on an upper surface and a side surface of the second 1st-conductivity type well,
   wherein the first 2nd-conductivity type diffusion layer is connected to the second 2nd-conductivity type diffusion layer by the first electrode,
   the first 2nd-conductivity type diffusion layer is connected to the third 2nd-conductivity type diffusion layer by the second electrode,
   the element isolation film is formed on a surface of the first 1st-conductivity type well, the element isolation film being located between the first electrode and the second electrode,
   the first 2nd-conductivity type diffusion layer located between the first electrode and the second electrode is located between two opposing sides of the element isolation film,
   the second 1st-conductivity type well is formed under the element isolation film, and
   the 1st-conductivity type diffusion layer is formed, in an element region, on the element isolation film side.

2. The solid-state image capturing device according to claim 1,
   wherein the second 1st-conductivity type well is formed, in an element region, on the element isolation film side, and
   the 1 st-conductivity type diffusion layer is connected to the second 1 st-conductivity type well.

3. The solid-state image capturing device according to claim 1,
   wherein the respective concentrations of the 1st-conductivity type diffusion layer and the second 1st-conductivity type well are higher than the concentration of the first 1st-conductivity type well.

4. The solid-state image capturing device according to claim 1,
   wherein a width of the first 2nd-conductivity type diffusion layer in parallel to a longitudinal direction of a side surface of the second electrode that opposes the first electrode is larger on the second electrode side than on the first electrode side.

5. The solid-state image capturing device according to claim 1,
   wherein a width of the 1 st-conductivity type diffusion layer in parallel to a longitudinal direction of a side surface of the second electrode that opposes the first electrode is smaller on the second electrode side than on the first electrode side.

6. The solid-state image capturing device according to claim 1, further comprising:
   a third electrode formed on a surface of the first 1st-conductivity type well via a third insulating film, and
   a fourth 2nd-conductivity type diffusion layer formed in the first 1st-conductivity type well,
   wherein the second 2nd-conductivity type diffusion layer is connected to the fourth 2nd-conductivity type diffusion layer by the third electrode.

7. The solid-state image capturing device according to claim 1, further comprising:
   a fourth electrode formed on a surface of the first 2nd-conductivity type diffusion layer via a fourth insulating film,
   wherein the fourth electrode is located adjacent to the first electrode.

8. A manufacturing method of a solid-state image capturing device, comprising:
   forming a second 1st-conductivity type well in a first 1st-conductivity type well;
   forming a first 2nd-conductivity type diffusion layer and a second 2nd-conductivity type diffusion layer in the first 1st-conductivity type well;
   forming a first electrode on a surface of the first 1st-conductivity type well via a first insulating film;

forming a 1st-conductivity type diffusion layer on surfaces of the first 2nd-conductivity type diffusion layer and the second 2nd-conductivity type diffusion layer in a self-aligned manner with respect to the first electrode;

forming a first electrode formed on a surface of the first 1st-conductivity type well via a first insulating film;

forming a second 2nd-conductivity type diffusion layer formed in the first 1st-conductivity type well;

forming a second electrode formed on a surface of the first 1st-conductivity type well via a second insulating film;

forming a third 2nd-conductivity type diffusion layer formed in the first 1st-conductivity type well; and forming an element isolation film on an upper surface and a side surface of the second 1st-conductivity type well, wherein the first 2nd-conductivity type diffusion layer is connected to the second 2nd-conductivity type diffusion layer by the first electrode, the second 1st-conductivity type well is formed in a boundary region between a side surface of the first 2nd-conductivity type diffusion layer and the first 1st-conductivity type well, the first 2nd-conductivity type diffusion layer is connected to the third 2nd-conductivity type diffusion layer by the second electrode, the element isolation film is formed on a surface of the first 1st-conductivity type well, the element isolation film being located between the first electrode and the second electrode, the first 2nd-conductivity type diffusion layer located between the first electrode and the second electrode is located between two opposing sides of the element isolation film, the second 1st-conductivity type well is formed under the element isolation film, and the 1st-conductivity type diffusion layer is formed, in an element region, on the element isolation film side.

9. The manufacturing method of a solid-state image capturing device according to claim 8, wherein the concentration of the 1st-conductivity type diffusion layer is higher than the concentration of the first 1st-conductivity type well.

10. A solid-state image capturing device comprising:

a first 1st-conductivity type well;

a first 2nd-conductivity type diffusion layer formed in the first 1st-conductivity type well;

a 1st-conductivity type diffusion layer formed on a surface of the first 2nd-conductivity type diffusion layer;

a second 1st-conductivity type well formed in a boundary region between a side surface of the first 2nd-conductivity type diffusion layer and the first 1st-conductivity type well;

a first electrode formed on a surface of the first 1st-conductivity type well via a first insulating film;

a second 2nd-conductivity type diffusion layer formed in the first 1st-conductivity type well;

a second electrode formed on a surface of the first 1st-conductivity type well via a second insulating film; and a third 2nd-conductivity type diffusion layer formed in the first 1st-conductivity type well, wherein the first 2nd-conductivity type diffusion layer is connected to the second 2nd-conductivity type diffusion layer by the first electrode, the first 2nd-conductivity type diffusion layer is connected to the third 2nd-conductivity type diffusion layer by the second electrode, and a width of the first 2nd-conductivity type diffusion layer in parallel to a longitudinal direction of a side surface of the second electrode that opposes the first electrode is larger on the second electrode side than on the first electrode side.

* * * * *